(12) United States Patent
Leibfritz

(10) Patent No.: US 10,132,908 B2
(45) Date of Patent: Nov. 20, 2018

(54) METHOD FOR THE CONTROLLED CONNECTION OF A CALIBRATION STANDARD IN A CALIBRATION MODULE AND AN ASSOCIATED CALIBRATION MODULE

(71) Applicant: Rohde & Schwarz GmbH & Co. KG, Munich (DE)

(72) Inventor: Martin Leibfritz, Aying (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 123 days.

(21) Appl. No.: 15/022,950

(22) PCT Filed: Dec. 9, 2014

(86) PCT No.: PCT/EP2014/077011
§ 371 (c)(1),
(2) Date: Mar. 18, 2016

(87) PCT Pub. No.: WO2015/091100
PCT Pub. Date: Jun. 25, 2015

(65) Prior Publication Data
US 2016/0238688 A1 Aug. 18, 2016

(30) Foreign Application Priority Data
Dec. 16, 2013 (DE) .................. 10 2013 226 065

(51) Int. Cl.
*G01R 35/00* (2006.01)
*G01R 27/28* (2006.01)

(52) U.S. Cl.
CPC .......... *G01R 35/007* (2013.01); *G01R 27/28* (2013.01); *G01R 35/005* (2013.01)

(58) Field of Classification Search
CPC .......... G01R 31/3191; G01R 33/0023; G01R 35/00; G01R 35/005; G01R 27/06;
(Continued)

(56) References Cited

U.S. PATENT DOCUMENTS 5,434,511 A   7/1995  Adamian et al.
5,587,934 A  12/1996  Oldfield et al.
(Continued)

OTHER PUBLICATIONS

Notification of Transmittal of Translation of the International Preliminary Report on Patentability (Chapter I or Chapter II) for International Application No. PCT/EP2014/077011, dated Jun. 30, 2016, 7 Pages.

*Primary Examiner* — Tung X Nguyen
*Assistant Examiner* — Robert P Alejnikov, Jr.
(74) *Attorney, Agent, or Firm* — Ditthavong & Steiner, P.C.

(57) ABSTRACT

A method according to the present disclosure for the controlled connection of a calibration standard in an associated calibration module to a port to be calibrated of a network analyzer connects the port to be calibrated of the network analyzer to a high-frequency port of the calibration module. It transmits a high-frequency signal generated in the network analyzer with an information signalling the calibration standard to be used to the high-frequency port of the calibration module. Within the calibration module, the information signalling the calibration standard to be used is detected from the high-frequency signal received in the calibration module, and the calibration standard to be used is connected to the high-frequency port of the calibration module by a control unit integrated in the calibration module.

13 Claims, 4 Drawing Sheets

(58) Field of Classification Search
CPC ........ G01R 27/28; G01R 27/30; G01R 13/00;
G01R 23/00; G01R 23/16; G01R 23/18;
G01R 31/2822; G01R 31/31708; G01R
1/28; G01R 11/00; G01R 11/32; G01R
21/005; G01R 22/00; G01R 35/04; G01R
13/30; G01R 17/14; G01R 17/22; G01R
33/0017; G01R 33/0035; G01N 22/00;
G01N 22/02; G01N 22/04; G01N
33/0006; G01N 33/007; G01N 35/00594;
G01N 35/00693; G05B 2219/37348;
G05B 2219/37545
USPC .......... 324/601, 637–648, 750.02, 76.19, 74,
324/130, 202; 702/85; 71/1.01
See application file for complete search history.

(56) References Cited

U.S. PATENT DOCUMENTS

| | | | |
|---|---|---|---|
| 6,529,844 B1 | 3/2003 | Kapetanic et al. | |
| 7,646,267 B1* | 1/2010 | Tsironis | G01R 27/32 333/17.3 |
| 8,269,508 B2* | 9/2012 | Gasseling | G01R 31/2822 324/601 |
| 2005/0107972 A1 | 5/2005 | Wong et al. | |
| 2005/0200365 A1* | 9/2005 | Bradley | G01R 27/04 324/601 |
| 2008/0106277 A1* | 5/2008 | Pillai | G01R 31/2822 324/750.02 |
| 2008/0197858 A1* | 8/2008 | Martens | G01R 27/32 324/601 |
| 2009/0322347 A1 | 12/2009 | Hashimshony et al. | |

* cited by examiner

METHOD FOR THE CONTROLLED CONNECTION OF A CALIBRATION STANDARD IN A CALIBRATION MODULE AND AN ASSOCIATED CALIBRATION MODULE

CROSS-REFERENCE TO RELATED APPLICATIONS

The present application is a national phase application of PCT Application No. PCT/EP2014/077011, filed Dec. 9, 2014, which claims priority to German Patent Application No. 10 2013 226 065.2, filed on Dec. 16, 2013, the entire contents of which are herein incorporated by reference.

TECHNICAL FIELD

The present disclosure, according to the various embodiments described herein, relates to a method for the controlled connection of a calibration standard in a calibration module and an associated calibration module.

BACKGROUND

When measuring a device under test with a network analyser, system errors occur—for example, error matching between the input impedance of the network analyser and the impedance of the measurement line—which can falsify the determined measurement parameters if they are not taken into account in the measurement. With regard to a determination of the measurement parameters from which system errors have been removed, these are determined within the framework of a calibration of the network analyser using a calibration module.

For this purpose, the individual ports of the network analyser to be calibrated are each connected in succession to several calibration standards integrated in the calibration module. Then, by means of excitation of the respective calibration standard via the port of the network analyser connected to the calibration standard, the high-frequency wave reflected from the calibration standard is measured at the port of the network analyser and supplied to a calibration method for the determination of the system errors.

The sequential connection of the individual calibration standards of the calibration module to the port of the network analyser to be calibrated is implemented respectively via a control unit integrated in the calibration module. As described in US 2009/0322347 A1, the control unit is therefore supplied, via a separate control line from the network analyser, with the information about the calibration standard subsequently to be connected to the port of the network analyser to be calibrated.

The additional control line complicates the calibration process because an additional line must be plugged in, and for this purpose, disadvantageously requires a more effort-intensive calibration module with an additional port. Especially for applications in which the device under test and therefore also the calibration module is positioned at a relatively large distance from the measuring network analyser, the control line must disadvantageously be reconnected respectively before each calibration process.

SUMMARY

Accordingly, there is provided a method for the controlled connection of a calibration standard in a calibration module which is characterised by a reduced effort, and an associated calibration module with a reduced complexity.

According to the certain embodiments, an information with which the calibration standard to be used in the calibration module is signalled is transmitted without the use of a separate control line, via an already available line which connects the port to be calibrated of the network analyser to a high-frequency port of the calibration module. For this purpose, the high-frequency signal with this information is linked in the network analyser and this information is detected from the high-frequency signal received at the high-frequency port of the calibration module and used for the control of the calibration standard to be used by a control unit.

The acknowledgement of the information with which the calibration standard to be used in the calibration module in the subsequent calibration is signalled is preferably implemented to the network analyser by the calibration module, preferably by the control unit, which sequentially connects two different calibration standards to the high-frequency port for this purpose. The sequence of two calibration standards preferably used by the control unit in this context, comprising respectively a reflecting or a non-reflecting calibration standard, represents a coded information about the calibration standard used for the subsequent calibration from, for example, four possible calibration standards. For example, via two reflection measurements implemented sequentially within the same period of time at the high-frequency port of the calibration module, the network analyser determines the calibration standards used sequentially by the control unit in each case and accordingly the calibration standard determined and acknowledged by the control unit for the subsequent calibration.

In a first embodiment, the high-frequency signal with the information about the calibration standard to be used in the calibration module is transmitted from the high-frequency port of the calibration module via a network for DC-voltage and high-frequency decoupling (English: bias-tee) to the detector and detected there.

Since the DC-voltage path of this network connected to the high-frequency port for the DC- and AC-voltage decoupling above a given threshold frequency—typically, for example, of a 10 MHz—provides a high loss and accordingly prevents a transmission between high-frequency port and the DC- and AC-voltage port of this network for the DC- and AC-voltage decoupling, the transmission of the high-frequency signal is preferably implemented below this threshold frequency, while the implementation of the calibration takes place above this threshold frequency.

The linking of the high-frequency signal with the information about the calibration standard to be used in the calibration module preferably corresponds to a binary amplitude-shift keying (English: Amplitude Shift Keying (ASK)), in which the high-frequency signal is modulated in the network analyser corresponding to the calibration standards to be used in each case with a quaternary modulation symbol, and accordingly provides a sequence of two switched-on and switched-off states respectively.

A second embodiment is used in the case of the network analysis of a high-frequency amplifier, in which a high-pass filter is connected in series to the high-frequency amplifier. Since a high-frequency signal with a frequency below the threshold frequency named above is filtered through the high-pass filter in this case and does not therefore reach the calibration module at all, the frequency of the high-frequency signal is accordingly increased and matched to the pass range of the high-pass filter.

In this case, the detection from the carrier signal of the information about the calibration standard to be used in the calibration module is preferably implemented with a power detector used as a calibration standard, which is connected to the high-frequency port of the calibration module at the beginning of the second embodiment. The two successive switched-on and respectively switched-off states of the high-frequency signal, which correspond to the modulation symbol associated with the calibration standard to be used, are each determined via a power-level measurement and supplied to the detector.

In a third embodiment, a detector diode which is coupled via a coupler to the high-frequency port of the calibration module is used. The high-frequency signal received by the detector diode is supplied to the detector.

Alongside the acknowledgement of the calibration standard to be used, through an additional connection by the control unit of a sequence of reflecting or non-reflecting calibration standards to the high-frequency port of the calibration module and an associated sequence of reflection measurements by the network administrator at the high-frequency port of the calibration module, an additional coded information are preferably transmitted from the calibration module to the network analyser, with which characteristics of the calibration standard used—for example, the correctly measured impedance of the calibration standards used—are signalled to the network analyser.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The method according to the embodiments for the controlled connection of a calibration standard in the calibration module and the calibration module are explained in detail in the following on the basis of the drawings by way of example. The figures of the drawings show.

DETAILED DESCRIPTION

Figure 1:
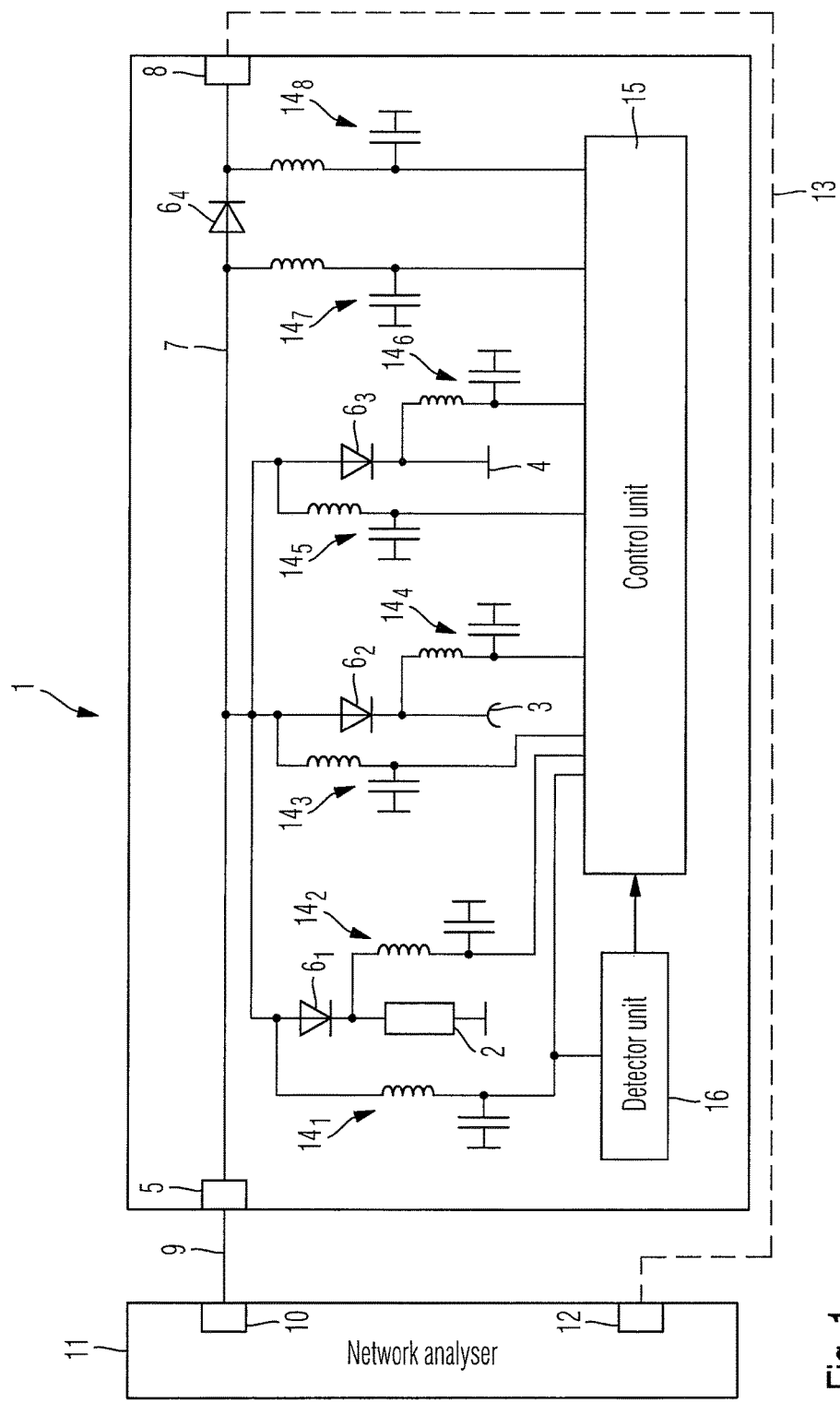
FIG. 1 a block-circuit diagram of a first exemplary embodiment of the calibration module is illustrated.

In the following, three embodiments of the calibration module according to the present disclosure are explained on the basis of FIGS. 1 to 3. The reference numbers in these drawings have been used in a uniform manner as far as possible.

In the first embodiment of the calibration module 1 according to FIG. 1, a calibration standard 2 realised as a matched impedance of typically 50 ohms is connected in each case via a PIN-diode $6_1$, a calibration standard 3 realised as an "open connection" is connected via a PIN-diode $6_2$, and a calibration standard 4 realised as a short is connected via a PIN-diode $6_3$ to a high-frequency port 5 of the calibration module 1—which is designated in the following as the first high-frequency port 5. Additionally, a calibration standard 7, which is realised as a "through-connection" without substantial ohmic losses, is connected via a PIN-diode $6_4$ between first high-frequency port 5 and high-frequency port 8 of the calibration module 1—which is designated in the following as the second high-frequency port 8.

The first high-frequency port 5 is connected via a high-frequency measurement line 9 to a port 10 to be calibrated of the network analyser 11, while a second high-frequency port 8 can be connected to a further port 12 to be calibrated of the network analyser 11 via a high-frequency measurement line 13 illustrated with a dashed line in FIG. 1.

The anode and the cathode of each of the PIN-diodes $6_1$ to $6_4$ is connected in each case via a network for DC- and AC-voltage decoupling $14_1$, $14_2$, $14_3$, $14_4$, $14_5$, $14_6$, $14_7$, $14_8$ to a control unit 15. Each of these networks for the DC- and AC-voltage decoupling (English: bias-tee) $14_1$, $14_2$, $14_3$, $14_4$, $14_5$, $14_6$, $14_7$, $14_8$ comprises an inductance at its DC-voltage port which is connected to the anode or respectively the cathode of the respective PIN-diode $6_1$ to $6_4$ and to a capacitor at its AC-voltage port. The DC- and AC-voltage port of the respective bias-tee $14_1$, $14_2$, $14_3$, $14_4$, $14_5$, $14_6$, $14_7$, $14_8$ which is connected to the control unit 15, is disposed at the nodal point between the respective inductance and the respective capacitance.

If the anode of the respective PIN-diode $6_1$ to $6_4$ is charged, via the respectively allocated bias-tee $14_1$, $14_2$, $14_3$, $14_4$, $14_5$, $14_6$, $14_7$, $14_8$, with a voltage which is designed to be higher, at least by the pass voltage of the respective PIN-diode $6_1$ to $6_4$ of, for example, 0.7 V, than the voltage with which the control unit 15 charges the cathode of the respective PIN-diode $6_1$ to $6_4$ via the respectively allocated bias-tee $14_1$, $14_2$, $14_3$, $14_4$, $14_5$, $14_6$, $14_7$, $14_8$, the respective PIN diode $6_1$ to $6_4$ is conducting and connects the respective calibration standard 2, 3 and 4 to the first high-frequency port 5 or respectively connects the "through connection" 7 to the first high-frequency port 5 and to the second high-frequency port 8.

If, by contrast, the anode of the respective PIN-diode $6_1$ to $6_4$ is charged by the control unit 15 via the respectively allocated bias-tee $14_1$, $14_2$, $14_3$, $14_4$, $14_5$, $14_6$, $14_7$, $14_8$ with a voltage which is negative by comparison with the voltage with which the cathode of the respective PIN-diode $6_1$ to $6_4$ is charged by the control unit 15 via the respectively allocated bias-tee $14_1$, $14_2$, $14_3$, $14_4$, $14_5$, $14_6$, $14_7$, $14_8$, the respective PIN-diode $6_1$ to $6_4$ is blocked and separates the respective calibration standard 2, 3 and 4 from the first high-frequency port 5 or respectively separates the "through connection" 7 from the first high-frequency port 5 and from the second high-frequency port 8.

In this manner, through an appropriate control of the individual PIN-diodes $6_1$ to $6_4$, the control unit 15 can connect only one of the calibration standards 2, 3, 4 and 7 in each case to the first high-frequency port 5 or respectively, in the case of the "through connection" 7, to the second high-frequency port 8.

In the case of the first embodiment of the calibration module 1, the high-frequency signal generated by the network analyser 11, which is transmitted from the port 10 of the network analyser 11 via the high-frequency measurement line 9 to the first high-frequency port 5 of the calibration module 1, is guided via a bias-tee $14_1$, $14_2$, $14_3$, $14_4$, $14_5$, $14_6$, $14_7$, $14_8$—for example, via the bias-tee $14_1$ illustrated on the left-hand side in FIG. 1—to a detector unit 16.

Figure 4:
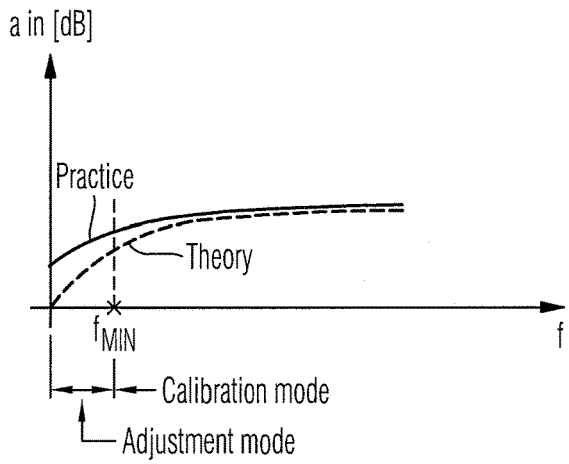
FIG. 4 a spectral display of the transmission behaviour of a bias-tee.

Since a bias-tee provides a spectral transmission behaviour as shown in FIG. 4—a theoretical curve and a curve measured in practice of the spectral transmission behaviour are shown here—the frequency of the high-frequency signal should be designed to be disposed below the threshold frequency $f_{MIN}$, and accordingly the high-frequency signal is not filtered by the bias-tee and can be unambiguously detected by the control unit 15. A signal with a frequency above the threshold frequency $f_{MIN}$ is attenuated by the respective bias-tee $14_1$, $14_2$, $14_3$, $14_4$, $14_3$, $14_6$, $14_7$, $14_8$ in order not to disturb the control of the individual PIN-diodes $6_1$ to $6_4$ through the control unit 15 and accordingly not to disturb the calibration operation implemented in this frequency range.

In order to communicate the detected information about the calibration standard to be used, the detector 16 is connected to the control unit 15, which connects the calibration standard to be used respectively to the first high-frequency port 5 or respectively, in the case of the "through connection" 7, to the first high-frequency port 5 and to the second high-frequency port 8.

Figure 2:
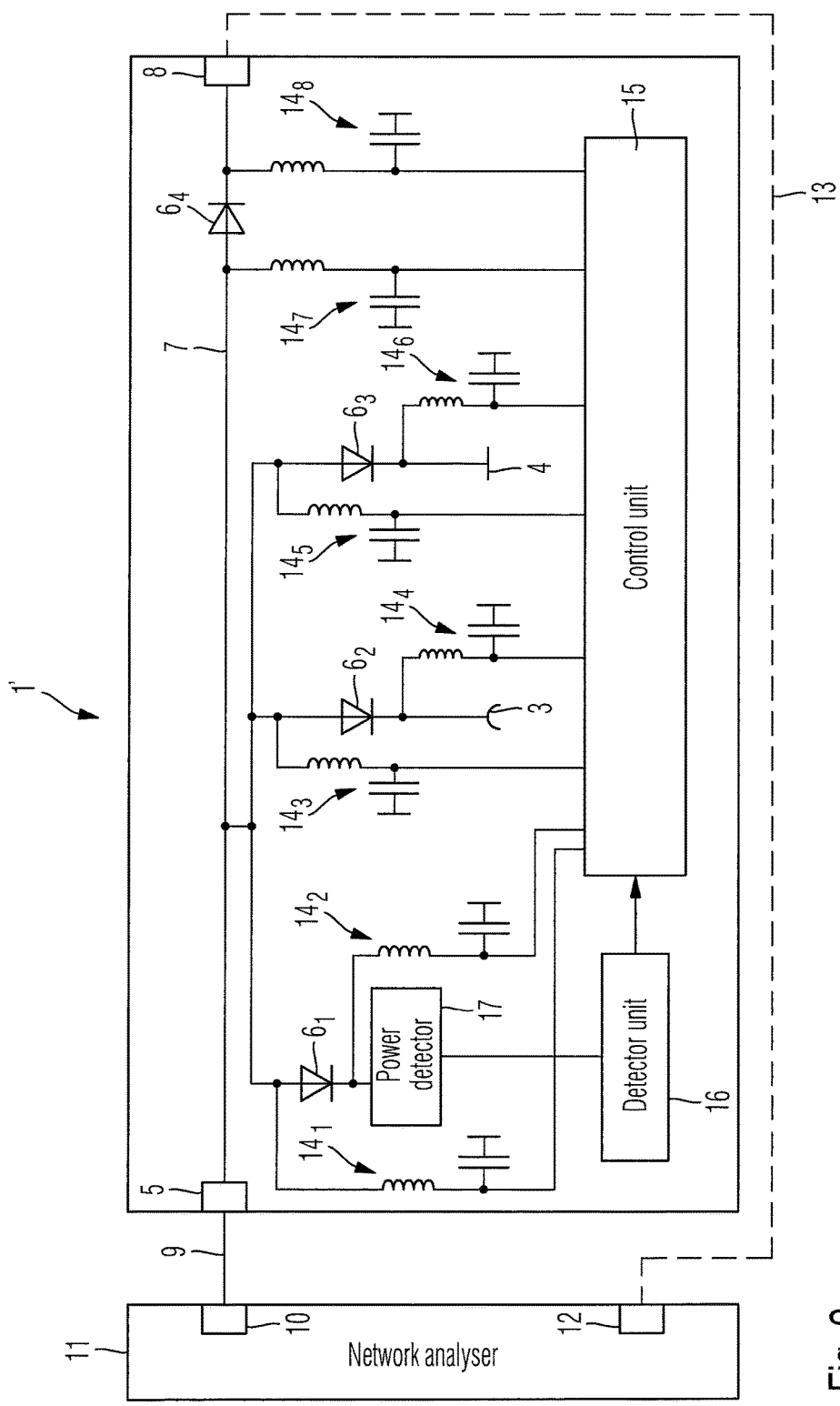
FIG. 2 a block-circuit diagram of a second embodiment of the calibration module is illustrated.

In the second embodiment of the calibration module 1' according to FIG. 2, the high-frequency signal with the information about the calibration standard to be used from the first high-frequency port 5 is not connected with the bias-tee to the unit for detection 16, but a power detector 17 connected to the first high-frequency port 5 at the beginning of the method and realised as a calibration standard determines the power level of the high-frequency signal at the individual timing points at which the high-frequency signal is either activated or non-activated on the basis of the binary amplitude-shift keying.

The power level of the high-frequency signal measured at each of the two timing points is communicated to the control unit 15 in each case as a data word or as a combined data word in a given data format. Alternatively, an average, effective power-level measurement can also be implemented over a period of time which extends over both of the timing points. The effective power-level value measured here is different for each of the four modulation states or respectively modulation symbols and can be communicated to the control unit 15 as a single data word in a given data format.

For the correct calibration of the network analyser 11, the power detector must provide a matched input impedance of, for example, 50 ohms, in order to be used as an optimally non-reflecting calibration standard.

Figure 3:
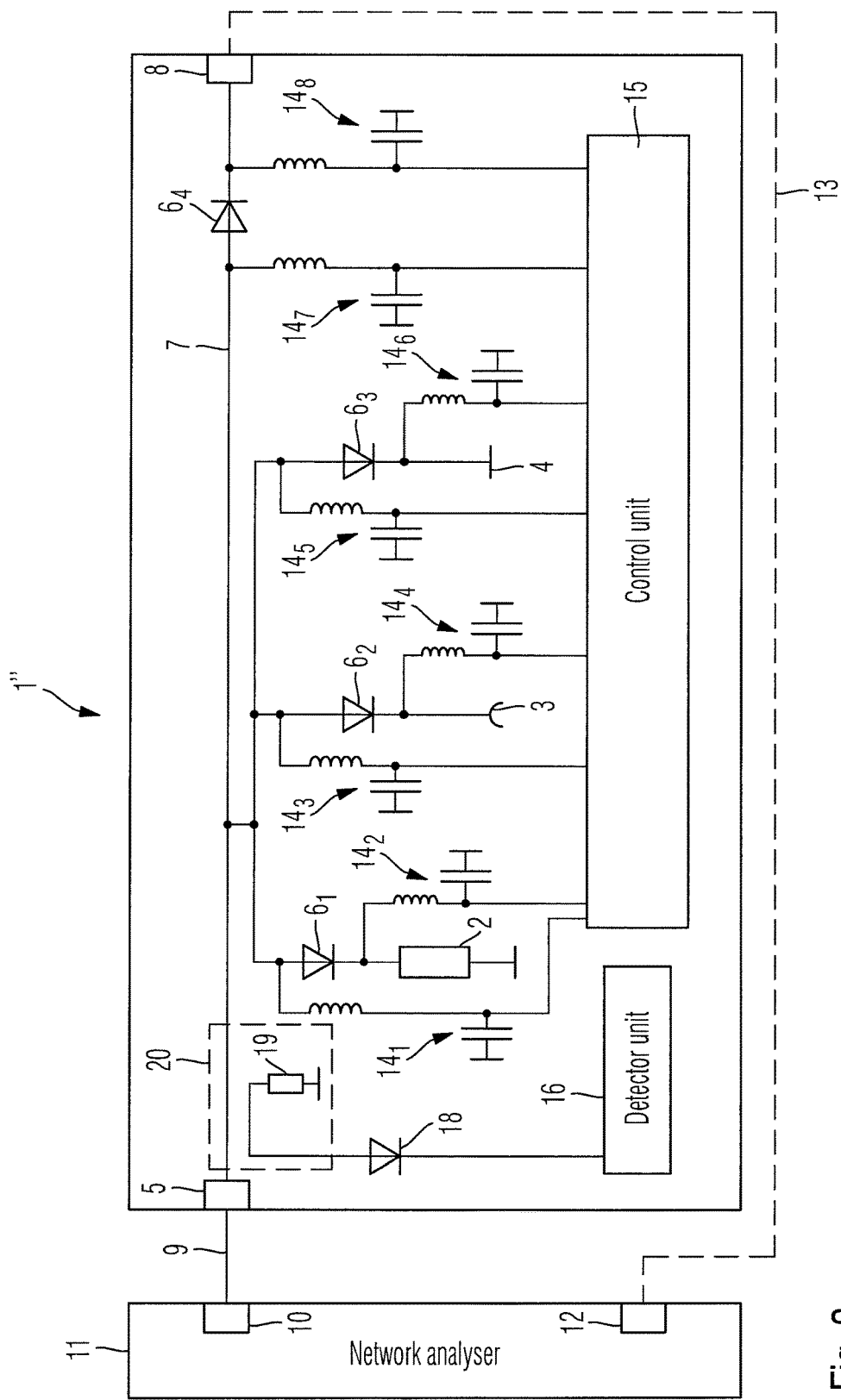
FIG. 3 a block-circuit diagram of a third embodiment of the calibration module is illustrated.

In the third embodiment of the calibration module 1" as shown in FIG. 3, the high-frequency signal with the information signalling the calibration standard to be used at the output of the first high-frequency port 5 is guided via a coupler 20 to a broadband detector diode 18. This coupler 20 is preferably realised as a directional coupler 20, which is terminated on its insulation path with an impedance 19 of preferably 50 ohms connected to ground and connected in its coupling path to the detector diode 18. The coupler 20 provides a coupling loss of typically 20 dB.

In the detector diode 18, the high-frequency signal is rectified and attenuated. A capacitor optionally connected downstream of the detector diode 18 and guided to ground, which is not illustrated in FIG. 3, can implement an optional smoothing of the high-frequency signal. The rectified high-frequency signal is supplied to the detector unit 16 in which the information about the calibration standard to be used is determined, which is then supplied to the control unit 15.

Figure 5:
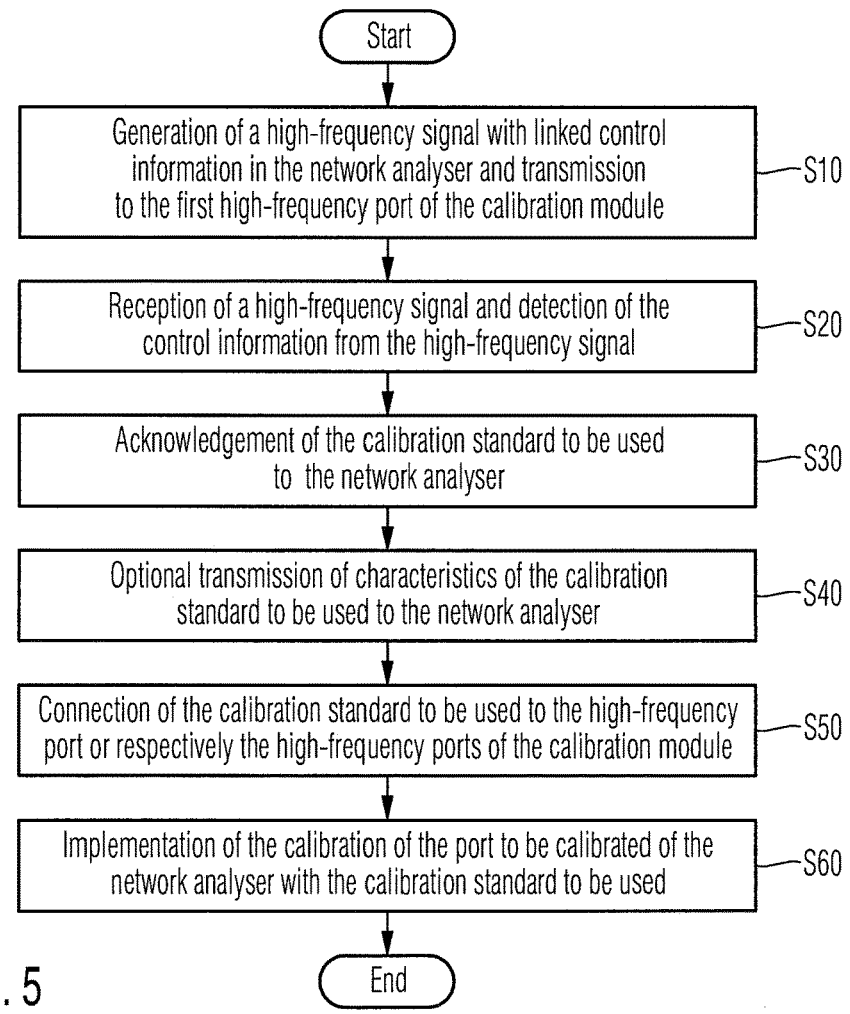
FIG. 5 a flow diagram of the method for the controlled connection of a calibration standard in the calibration module.

In the following, the method for the controlled connection of a calibration standard in a calibration module is explained in detail with reference to the flow diagram in FIG. 5.

In the first method step S10, the high-frequency signal is linked in the network analyser 11 with the information signalling the calibration standard to be used. The high-frequency signal is a sinusoidal signal generated by a local frequency oscillator with a single frequency component, a so-called Continuous Wave (CW) signal.

To signal the total of four calibration standards, a total of four different modulation symbols or modulation states are necessary. Accordingly, the information signalling the calibration standard to be used is modulated up to the high-frequency signal by means of a binary Amplitude Shift Keying (ASK) of the high-frequency signal. The binary amplitude-shift keying of the high-frequency signal is thus realised by connecting, via a switching unit integrated in the network analyser 11 but not illustrated in FIGS. 1-3, either the high-frequency signal generated in a local frequency oscillator of the network analyser 11, and also not illustrated in FIGS. 1-3, or by connecting no signal. To double the realisation of two binary states provided in this manner up to a total of four states, the binary amplitude-shift keying is applied twice in succession to the high-frequency signal.

The high-frequency signal with the information about the calibration standard to be used in the calibration module is transmitted from the port 10 of the network analyser 11 via the high-frequency measurement line 9 to the first high-frequency port 5 of the calibration module 1, 1', and 1".

In the next method step S20, the high-frequency signal received in the calibration module 1, 1' and 1" is supplied either via a bias-tee $14_1$, $14_2$, $14_3$, $14_4$, $14_5$, $14_6$, $14_7$, $14_8$ galvanically coupled to the output of the first high-frequency port 5 or via a broadband detector diode 18 of the detector unit 16 coupled to a (directional) coupler. As an alternative, the power-level values of the high-frequency signal are registered and supplied to the detector unit 16 in a power detector 17 used as a calibration standard, which is connected at the beginning of the method to the first high-frequency port 5 of the calibration module 1'.

In the detector unit 16, the information signalling the calibration standard to be used is determined from the supplied high-frequency signal or respectively from the supplied registered power-level values of the high-frequency signal. The correspondence between the calibration standard to be used and the associated modulation symbol or respectively modulation state modulated up to the high-frequency signal are known both to the network analyser 11 and also to the detector unit 16.

In the next method step S30, after the communication of the information about the calibration standard to be used to the control unit 15, the acknowledgement of this information to the network analyser 11 is implemented. Once again, an information coding the calibration standard to be used is signalled to the network analyser 11. The signalling of this coding information which, once again, represents a sequence of two or more binary informations, is implemented in the exemplary embodiment by a sequential connection of a reflecting calibration standard—that is, either a calibration standard 3 realised as an "open connection" or a calibration standard 4 realised as a short—and/or of a non-reflected calibration standard—that is, a calibration standard 2 realised as a matched impedance in the case of the first and third embodiment of the calibration module 1 and 1", or of a calibration standard realised as a power detector 17 with matched impedance in the case of the second embodiment of the calibration module 1'- to a first high-frequency port 5 of the calibration module by the control unit 15.

The identification of the reflecting and/or non-reflecting calibration standard connected to the first high-frequency port 5 of the calibration module 1, 1' or respectively 1" in each case at two successive timing points, and accordingly the identification of the sequence of two or more binary-coded informations, which correspond to the calibration standard to be used, is implemented through a reflection measurement at the first high-frequency port 5 of the calibration module 1, 1' or respectively 1" by the network analyser 11.

Since the reflection behaviour of a reflecting calibration standard can be unambiguously distinguished from the reflection behaviour of a non-reflecting calibration standard in this manner, the network analyser 11 can unambiguously check the correct reception of the information signalling the calibration standard to be used, and accordingly, the correct adjustment of the calibration standard to be used in the subsequent calibration of the calibration module 1, 1' or respectively 1".

The connection of a reflecting or non-reflecting calibration standard to the first high-frequency port 5 by the control unit 15 and the implementation of the reflection measurement by the network analyser 11 with regard to a successful acknowledgement of the calibration standard to be used is suitable for synchronisation and takes place delayed by a given time interval—for example, 100 ms—with reference to the transmission of the high-frequency signal.

In the next optionally implemented method step S40, characteristics of the calibration standards to be used, which are determined at the end of the manufacture of the calibration module 1, 1' or respectively 1" and are stored, for example, in a so-called and standardised "Touch-Stone File" in a memory of the calibration module 1, 1' or respectively 1" not shown in FIGS. 1-3 by the manufacturer of the calibration module 1, 1' or respectively 1", are transmitted in an equivalent manner to the network analyser 11 for the acknowledgement according to method step S30 of the calibration standard to be used in the future calibration.

Since these characteristics—for example, the exact determined impedance value of the respective calibration standard or the valid measurement frequency range for the respective calibration standard—are significantly more complex than the type of calibration standard to be used in the next calibration, the weighting of the coding information for the characteristics data-word to be transmitted is significantly higher and therefore also leads to a more comprehensive sequence of reflecting and/or non-reflecting calibration standards, which must be connected by the control unit 15 to the first high-frequency port 5, and to a more comprehensive sequence of reflection measurements by the network analyser 11.

The next method step S50 contains the connection of the calibration standard to be used in the subsequent calibration to the first high-frequency port 5 by the control unit 15 through appropriate biasing of the anode and cathode of the PIN-diode associated with the calibration standard to be used via the respectively allocated bias-tees and corresponding inverse biasing of the anodes and cathodes of the PIN-diodes associated with the calibration standards not to be used.

In the final method step S60, the calibration of the port 10 to be calibrated of the network analyser 11 connected to the first high-frequency port 5 of the calibration module via the high-frequency measurement line 9 is implemented using the calibration standard connected to the first high-frequency port 5—or respectively using the calibration standard connected to the first high-frequency port 5 and to the second high-frequency port 8 and realised as a "through connection" 7.

For the calibration of the port 10 to be calibrated of the network analyser 11 with a further calibration standard, the individual method steps S10 to S60 of the method are repeated. For the calibration of a further port to be calibrated—for example, the port 12 of the network analyser 11—the individual method steps S10 to S60 of the method are also used in an equivalent manner.

The control unit 15 and the detector unit 16 are typically realised and integrated in one, especially in one single, programmable hardware module—for example, in a Field Programmable Gate Array (FPGA) or in an Application Specific Integrated Circuit (ASIC).

Optionally, after connection of the port 10 of the network analyser 11 to the first high-frequency port 5 of the calibration module 1, 1' and 1" at the beginning of the method, it is also possible to implement the characterisation of the calibration module 1, 1' and 1" by the network analyser 11 at a frequency below the threshold frequency $f_{MIN}$ through a high-frequency signal with a linked information which requests the calibration module 1, 1' and 1" for its characterisation. In this context, the transmission of the specific characterisation of the calibration module 1, 1' and 1" by transmitting the checksum of the characterisation to the network analyser 11 can be implemented according to the same technical principle as the acknowledgement of the calibration standard to be used.

The present disclosure is not restricted to the embodiments presented. In particular, all combinations of all features claimed respectively in the individual claims, all features disclosed respectively in the description and all features illustrated in the individual Figs. of the drawings are also covered by the present disclosure. Alongside the modulation of the high-frequency signal with the information signalling the calibration standard to be used by means of a binary amplitude-shift keying, other modulation methods are also suitable and are also covered by the present disclosure.

The invention claimed is:

1. A method for the controlled connection of a calibration standard in a calibration module to a port to be calibrated of a network analyser, the method comprising:
   connecting the port to be calibrated of the network analyser to a high-frequency port of the calibration module;
   transmitting a high-frequency signal generated in the network analyser with an information signalling the calibration standard to be used to the high-frequency port of the calibration module; and
   detecting the information signalling the calibration standard to be used from the high-frequency signal received in the calibration module and connection of the calibration standard to be used to the high-frequency port of the calibration module by a control unit integrated in the calibration module,
   wherein the high-frequency signal are transmitted from the high-frequency port to the control unit via a bias-tee.

2. The method according to claim 1, wherein:
   the calibration standard to be used is acknowledged to the network analyser by the control unit in that either a reflecting or a non-reflecting calibration standard is connected sequentially to the high-frequency port by the control unit, and the sequence of the reflecting or the non-reflecting calibration standard in each case represents an information coding the calibration standard to be used.

3. The method according to claim 2, wherein the sequence of reflecting or non-reflecting calibration standards connected to the high-frequency port is identified by a sequence of reflection measurements by the network analyser at the high-frequency port of the calibration module.

4. The method according to claim 3, wherein the acknowledgement and the two reflection measurements are each implemented with a time delay by an identical time interval from the transmission of the high-frequency signal.

5. The method according to claim 1, wherein the linking of the high-frequency signal with the information signaling the calibration standard to be used takes place by binary amplitude-shift keying of the high-frequency signal.

6. The method according to claim 1, wherein the high-frequency signal provides a frequency below a lower threshold frequency f with which the calibration is implemented.

7. The method according to claim 6, wherein the output signal of the bias-tee or of the detector diode or the pulse sequence generated by the power detector is used for the detection, and the detected information signaling the calibration standard to be used is transmitted to the control unit.

8. The method according to claim 1, wherein the high-frequency signal is transmitted from the high-frequency port to a power detector used as a non-reflecting calibration standard, which is connected to the high-frequency port at the beginning of the method.

9. The method according claim 1, wherein the high-frequency signal is transmitted to a detector diode coupled with the high-frequency port.

10. The method according to claim 1, wherein:

additional characteristics of the calibration standard to be used, which are deposited in a memory integrated in the control unit, are signaled by the control unit through a sequence of reflecting or non-reflecting calibration standards connected in each case to the high-frequency port, which the network analyser identifies through a corresponding sequence of reflection measurements at the high-frequency port, and the sequence of reflecting or non-reflecting calibration standards connected in each case to the high-frequency port represents an information coding the additional characteristics.

11. A calibration module for calibrating a port of a network analyser including a high-frequency port, a plurality of calibration standards, and a control unit for the alternative connection of one of the calibration standards to the high-frequency port, the calibration module comprising:

a detector unit for detecting an information signaling the calibration standard to be used from a high-frequency signal generated by the network analyser and transmitted to the high-frequency port is connected upstream of the control unit, wherein a bias-tee, which is provided respectively for every connection of a calibration standard to the high-frequency port, is connected upstream of the detector unit.

12. The calibration module according to claim 11, wherein a power detector used as a non-reflecting calibration standard is connected upstream of the detector unit.

13. The calibration module according to claim 11, wherein a detector diode, which is coupled with the high-frequency port via a coupler, is connected upstream of the detector unit.

* * * * *